(12) United States Patent
Wang

(10) Patent No.: US 8,071,466 B1
(45) Date of Patent: Dec. 6, 2011

(54) ZINC SULFIDE CRYSTALS FOR OPTICAL COMPONENTS

(75) Inventor: Shaoping Wang, Brookfield, CT (US)

(73) Assignee: Fairfield Crystal Technology, LLC, New Milford, CT (US)

( * ) Notice: Subject to any disclaimer, the term of this patent is extended or adjusted under 35 U.S.C. 154(b) by 378 days.

(21) Appl. No.: 12/338,088

(22) Filed: Dec. 18, 2008

Related U.S. Application Data

(60) Provisional application No. 61/009,370, filed on Dec. 28, 2007.

(51) Int. Cl.
*H01L 21/00* (2006.01)

(52) U.S. Cl. ........ 438/482; 117/104; 117/105; 117/108; 117/946

(58) Field of Classification Search .................. 117/104, 117/105, 108, 946; 438/483, 482
See application file for complete search history.

(56) References Cited

U.S. PATENT DOCUMENTS

| | | | |
|---|---|---|---|
| 4,944,900 A | 7/1990 | Willingham et al. | |
| 5,274,248 A | 12/1993 | Yokogawa et al. | |
| 5,541,948 A | 7/1996 | Krupke et al. | |
| 7,279,040 B1 | 10/2007 | Wang | |
| 2003/0006406 A1* | 1/2003 | Chikyow et al. | 257/12 |
| 2004/0211972 A1* | 10/2004 | Du et al. | 257/99 |
| 2010/0084664 A1* | 4/2010 | Wang | 257/78 |

OTHER PUBLICATIONS

Yoo et al. "Heteroepitaxy of Hexagonal ZnS Thin Films directly on Si (111)," Jpn, J. Appl. Phys, 42, pp. 7029, 2003.*

* cited by examiner

*Primary Examiner* — Matthew Reames
(74) *Attorney, Agent, or Firm* — Michaud-Kinney Group LLP

(57) ABSTRACT

Zinc sulfide (ZnS) single crystals and multi-grain ZnS crystals are suitable for many applications. The disclosed method produces ZnS single crystals or multi-grain ZnS crystals. More specifically, ZnS single crystals or multi-grain ZnS crystals of pure or substantially pure hexagonal wurtzite structure with sufficiently high purity and crystalline perfection to be used to fabricate components and devices including but not limited to optical components (useful in the infrared (IR) & visible spectrum range of 0.34-14 μm), photoluminescence devices, cathode luminescence devices, electroluminescence devices, semiconductor devices, and IR laser gain mediums (in the wave length range of 1-5 μm).

11 Claims, 2 Drawing Sheets

ZINC SULFIDE CRYSTALS FOR OPTICAL COMPONENTS

CROSS REFERENCE TO RELATED APPLICATION

This patent application claims priority to U.S. Provisional Patent Application Ser. No. 61/009,370, titled "Hexagonal Zinc Sulfide Crystals for Optical Components," and filed on Dec. 28, 2007. The subject matter of that provisional patent application is incorporated by reference in its entirety herein.

U.S. GOVERNMENT RIGHTS

N.A.

BACKGROUND

1. Field of the Invention

Disclosed herein are zinc sulfide (ZnS) single crystals and multi-grain ZnS crystals that possess physical properties effective for many optical applications. More specifically, the single crystals and multi-grain crystals are of pure or a substantially pure wurtzite structure with a high chemical purity and a high crystalline perfection and possess physical properties superior to commercially existing ZnS crystal materials. The crystals can be used to fabricate components or devices including, but not limited to, optical components (in infrared (IR) & visible spectrum, in the wavelength range of 0.34-14 μm), photoluminescence devices, cathode luminescence devices, electroluminescence devices, semiconductor devices, and laser gain medium for IR lasers (1-5 μm in wavelength). Also disclosed are methods of producing the aforementioned ZnS single crystals or multi-grain ZnS crystals.

2. Description of the Related Art

ZnS is a versatile material that has a variety of applications. Representative of current applications for ZnS are:

(1) High purity ZnS crystals are transparent in the visible and IR spectrum ranges (approximately 0.34-14 μm in wavelength) and can be used to fabricate optical components, such as forward looking infrared (FLIR) windows and other optical components operating in that wavelength range.

(2) ZnS doped with one or more impurities is a photoluminescence material useful as a scintillator or a phosphor for detecting or otherwise imaging (or image intensifying) UV lights, X-rays, gamma-rays and neutrons. Currently, only powder-based or thin-film-based ZnS polycrystalline materials are used for this application.

(3) ZnS doped with one or more impurities is an important cathode-luminescence material that is widely used in phosphor screens in display devices such as cathode ray tubes (CRTs), CRT-type TV sets, field-emission displays, and image intensifiers. Currently, only powder-based or thin-film-based ZnS polycrystalline materials are used for this application.

(4) ZnS doped with one or more impurities is also an important electroluminescence material that is used to fabricate a variety of electroluminescence devices, such as light emitting devices and flat panel displays (including single-color, multi-color, or full-color displays). Presently only thin-film-based polycrystalline ZnS is used for this application.

(5) As a II-VI wide band gap semiconductor material, ZnS, in a form of a single crystal or a multi-grain crystal (with an average crystal grain size larger than 1 mm), by itself or in combination with other II-VI, III-V, IV and other semiconductor materials, can be used to fabricate a variety semiconductor devices, such as light emitting diodes (LEDs), laser diodes (LDs), high frequency devices, high power devices, UV detectors, solar cells and photoconductive devices.

(6) A ZnS single crystal or a multi-grain ZnS crystal can also be used as a substrate (or template) for epitaxial growth of thin films (<10 μm in thickness) or thick films (10-1000 μm in thickness) of group III-nitride semiconductors, such as GaN, AlN, InN, and their alloys, and II-VI semiconductors, such as ZnO, ZnS, ZnSe, or as seeds (or templates) for growth of bulk crystals (larger than 1 mm in thickness in the growth direction) of group III-nitride semiconductors, such as GaN, AlN, InN, and their alloys, and II-VI semiconductors, such as ZnO, ZnS, ZnSe, that can be used to fabricate semiconductor devices including blue, UV and white LEDs, blue and UV LDs, UV detectors, high frequency devices, solar cells and photoconductive devices.

(7) A ZnS single crystal of high crystalline quality doped with a transition metal ion dopant (e.g. $Co^{+2}$, $Cr^{+2}$, $Fe^{+2}$) can be used as a laser gain medium for diode-pumped lasers operated in the near IR region (approximately 1-5 μm in wavelength).

Currently, powder-based or thin-film-based ZnS polycrystalline materials are usually used for these applications. A ZnS single crystal or a multi-grain ZnS crystal of pure or substantially pure wurtzite structure, which is not available commercially to date, may have a better performance.

ZnS typically crystallizes in one of two crystal structures: cubic (sphalerite, or zinc blende) and hexagonal (wurtzite). The currently commercially available ZnS materials are polycrystalline ZnS produced via a chemical vapor deposition (CVD) method, and CVD ZnS processed via a hot isostatic pressing (HIP) process (such as Cleartran ZnS, Multi-spectral ZnS) of mainly the cubic structure with crystal grain sizes in the range of approximately 3-10 μm for the CVD-ZnS and approximately 100-200 μm for Cleartran ZnS or multi-spectral ZnS materials. (Cleartran is a trademark of Morton International, Inc. Chicago, Ill.).

In addition to the cubic and hexagonal crystal structures, ZnS has many polytypes. Examples of ZnS polytypes are 4H, 6H, 8H, etc., (the hexagonal polytypes), and 12R, 24R, 30R, etc., (the rhombohedral polytypes). The cubic ZnS (also called 3C polytype) and the wurtzite-structure ZnS (also called 2H polytype) crystals are important for practical use. ZnS of different polytypes have different physical properties. For example, the band gap energy of cubic ZnS is about 2.7 eV, and the band gap of wurtzite-structure ZnS is about 2.8 eV. A ZnS crystal containing more than one polytype, i.e. mixed polytypes, may degrade its physical properties. Therefore, for many applications, it is favorable to use a ZnS single crystal of a pure or substantially pure polytype.

A first method to grow ZnS single crystals is melt-growth. ZnS melts congruently at about 1830° C. and can be grown from its melt. Melt-grown ZnS crystals were found to be of wurtzite structure. However, because the vapor pressure of ZnS at its melting point is very high (approximately 3.7 atm), ZnS crystal growth from the melt using a melt growth method, such as a Bridgman technique, has to be carried out at a very high Ar gas pressure (~50 atm) and the growth process is a safety hazard and difficult to control. Further, due to contaminants, mainly from the crucible material contacting the ZnS melt, melt-grown ZnS crystals were found to contain excessive amounts of undesirable impurities and crystalline defects.

A second growth method is a sublimation physical vapor transport (PVT). A PVT growth is essentially a sublimation and re-condensation process. A source material placed at the high temperature end of a crucible sublimes and the vapor species travel and re-condense onto the other end of the crucible at a lower temperature to form a crystal. Because ZnS sublimes at high temperatures (>1100° C.), ZnS single crystals can be grown via a sublimation PVT technique at a temperature significantly lower than the melting point of ZnS. Because ZnS has an appreciable vapor pressure only at a temperature higher than 1200° C., growth of ZnS single crystals using a PVT technique in the prior art was carried out in a temperature range of 1200-1600° C. During the 1950s and the 1960s, large single crystal grains up to 15 grams in weight were harvested from large multi-grain crystal boules grown at high growth temperatures of about 1400-1550° C. range and the ZnS crystals had a wurtzite structure. But the wurtzite-structure ZnS single crystals produced in this way were impure and of low crystalline perfection. For example, chemical etching revealed that etch-pit densities were in range of $10^5$-$10^8$ cm$^{-2}$. The impurities and defects are believed due to impure ZnS source materials and contaminants from the growth crucibles (containers) made of a mullite tube or a fused silica tube.

More recently, growth of ZnS single crystals of cubic structure has been attempted via a low-temperature (~1200-1250° C.) PVT growth technique. As a result, ZnS single crystals, up to 30 mm in diameter, of predominantly cubic structure with a small amount (less than 5% by volume) of wurtzite-structure can be produced. At present, predominant cubic-structure ZnS single crystals of about 10×10 mm$^2$ in area are commercially available in small, research quantities, such as from RMT Ltd. of Moscow, Russia. But, the growth rate at these low temperatures is quite low, typically less than 0.1 mm/hr.

Another method to grow ZnS single crystals of cubic structure is a chemical vapor transport using I (iodine) as a transport agent at a temperature of about 800-900° C. The cubic ZnS crystals produced in this way are doped by I (iodine) and therefore have an n-type conduction. Chemical etching revealed that etch-pit densities were in the range of $10^3$-$10^5$ cm$^{-2}$. Semiconductor devices built on such n-type cubic ZnS single crystals are disclosed in U.S. Pat. No. 5,274,248, Yokogawa, et al. However, the growth rate in iodine transport technique for ZnS is extremely slow (less than 0.05 mm/hr), which makes this method unfavorable for commercial volume production of ZnS single crystals.

The inventor believes that at present, there are no ZnS single crystals or multi-grain crystals made by any of the aforementioned methods that meet the requirements for many applications, such as optical components (in IR & visible spectrum in the wavelength range of 0.34-14 µm), photoluminescence devices, cathode luminescence devices, electroluminescence devices, and semiconductor devices.

In searching ZnS materials for forward looking infrared (FLIR) optical components operated in the wavelength range of 1-14 µm, researchers, mainly from Raytheon (Lexington, Mass.), produced ZnS polycrystalline materials for IR optical components via a CVD process, in which a Zn vapor and an $H_2S$ gas react to form ZnS and then deposit ZnS onto graphite substrates at a temperature of about 630-800° C. The as-grown CVD-ZnS, of essentially a cubic structure polycrystalline ZnS, had a poor transmission in the IR spectrum of 1-10 µm in wavelength, and had to be further processed via HIP to achieve an acceptable IR transmission for FLIR applications. The ZnS materials produced via CVD-HIP process are polycrystalline materials of cubic structure with an average grain size of 100-200 µm. At present, such ZnS materials are being marketed as Cleartran ZnS and Multi-spectrum ZnS. Cleartran ZnS and Multi-spectral ZnS materials still have some level of absorption and scattering likely due to residual structural defects and impurity clusters. Cleartran ZnS and Multi-spectral ZnS have a large bulk absorption coefficient (approximately 0.1-0.3 cm$^{-1}$) at 10.6 µm, the wavelength at which a high power $CO_2$ laser is operated, while a CVD zinc selenide (ZnSe) with a low bulk absorption coefficient (less than 0.001 cm$^{-1}$) at 10.6 µm is currently the choice of materials for fabricating optical components for high power $CO_2$ lasers. However, because of the high mechanical strength of ZnS, a ZnS with a low bulk absorption coefficient (less than 0.001 cm$^{-1}$) is more favorable for fabricating optical components for high power $CO_2$ lasers.

On the other hand, the CVD process for producing ZnS has a slow deposition rate (usually in the range of 0.05-0.1 mm/hr). CVD-ZnS crystals or Cleartran ZnS crystals are polycrystalline materials that cannot be used for applications such as semiconductor devices, laser mediums, substrate materials, etc. In addition, both the CVD process and the HIP process are a safety hazard and a costly process.

For optical applications, particularly IR applications including optics for FLIR and high power $CO_2$ lasers, there exists a need of ZnS single crystals or multi-grain ZnS crystals with a better performance and a less cost to produce. There also exists a need for ZnS single crystals or multi-grain ZnS crystals of pure or substantially pure hexagonal structure for many non-optical applications. There is also a potential use of ZnS crystals of substantially pure wurtzite structure in many applications that have not yet been identified.

BRIEF SUMMARY OF THE INVENTION

The details of one or more embodiments of the invention are set forth in the accompanying drawings and the description below. Other features, objects and advantages of the invention will be apparent from the description and drawings, and from the claims.

Disclosed herein are ZnS single crystals or multi-grain ZnS crystals that possess superior physical properties and are suitable for many applications, as well as methods to produce the ZnS single crystals or multi-grain ZnS crystals. More specifically, the zinc sulfide single crystals or multi-grain ZnS crystals of pure or substantially pure hexagonal wurtzite structure (with more than 95% of wurtzite structure in volume) can be used to fabricate components or devices including, but not limited to, optical components (in the IR & visible spectrum range of 0.34-14 µm), photoluminescence devices, cathode luminescence devices, electroluminescence devices, semiconductor devices, and IR laser gain mediums (in the wave length range of 1-5 µm). In addition, a zinc sulfide (ZnS) single crystals or multi-grain ZnS crystal of pure or substantially pure hexagonal wurtzite structure with a low bulk absorption coefficient (less than 0.001 cm$^{-1}$) is suitable for fabricating optical components for high power $CO_2$ lasers.

One embodiment of this invention is a ZnS single crystal or a multi-grain ZnS crystal of pure or substantially pure wurtzite structure with a high chemical purity (at least 99.999% by weight) and a high crystalline perfection that give rise to a high transmission, a low absorption and a low scattering of lights in the wavelength range of visible and IR (i.e. 0.34-14 µm) superior to cubic ZnS materials, such as CVD-ZnS, Cleartran ZnS or Multi-Spectral ZnS materials. These wurtzite-structure ZnS single crystals and multi-grain crystals are suitable for fabricating optical components including, but not limited to, IR, forward looking IR (FLIR) and high power $CO_2$ laser components, such as windows, lenses, prisms, beam splitters, filters, wave plates, operated in the visible and IR spectrum range of 0.34-14 µm in wavelength.

Another embodiment of this invention is a ZnS single crystal or a multi-grain ZnS crystal of pure or substantially pure wurtzite structure that is intentionally doped with one or more impurities including, but not limited to, the transition metal elements and rare-earth elements and such doped ZnS single crystals and multi-grain crystals are suitable for fabricating photoluminescence devices, such as scintillation detectors for detection or imaging of radiations of UV light, X-rays, gamma-rays, and neutrons.

Another embodiment in this invention is a ZnS single crystal or a multi-grain ZnS crystal of pure or substantially pure wurtzite structure that is intentionally doped with one or more impurities selected from the transition metal elements and rare-earth elements and such doped ZnS single crystals and multi-grain crystals are suitable for fabricating cathode luminescence devices, such as cathode ray tubes (CRTs), CRT-type television sets, field emission displays, or other devices for detection, displaying or imaging of electron beams (also known as cathode rays).

Yet another embodiment of this invention is a ZnS single crystal or a multi-grain ZnS crystal of pure or substantially pure wurtzite structure that is intentionally doped with one impurity (activator) or more impurities, and such doped ZnS single crystals and multi-grain crystals are suitable for fabricating electro-luminescence (EL) devices including but not limited to devices emitting visible lights (e.g. blue, green, yellow, red, and white) and electroluminescence displays of single color, multi-color, or full-color.

Still another embodiment of this invention is a ZnS single crystal or a multi-grain ZnS crystal or a multi-grain ZnS crystal of pure or substantially pure wurtzite structure that is unintentionally doped (that is doped with residual impurities from the ZnS source material) or intentionally doped with one or more electronically-active impurities so that the ZnS single crystals and multi-grain crystals are either electrically insulating, or semi-insulating, or conducting (i.e. low resistivity) with n-type conduction (e.g. in an indium-doped or iodine-doped ZnS) or p-type conduction (e.g. in a nitrogen-doped ZnS or triple-doped ZnS with Ag, In and N); and such ZnS single crystals and multi-grain crystals, usually in a wafer form or a substrate form with or without one or more thin film layers of ZnS or/and other II-VI, or III-V, III-nitrides, or chalcopyrite and related semiconductors (such as $CuInSe_2$ also referred to as CIS or $Cu(In,Ga)Se2$ that is also referred to as CIGS, both promising solar cell materials), and other semiconductor materials grown on the ZnS crystal wafers or substrates, are used to fabricate semiconductor devices including, but not limited to, light emitting diodes (LEDs), laser diodes (LDs), UV detectors, high frequency devices, high power devices, solar cells, photoconductive devices.

Another embodiment of this invention is that a ZnS single crystal or multi-grain ZnS crystal of pure or substantially pure wurtzite structure is used as a substrate for epitaxial growth of thin films (less than 10 μm in thickness), or thick films (of 10-1000 μm in thickness), or bulk crystals (larger than 1 mm in thickness in the growth direction) of group III-nitride, II-VI, group IV semiconductors and other semiconductors including, but not limited to, GaN, AlN, InN, $Ga_xIn_{1-x}N$ (0<x<1), $Ga_xAl_{1-x}N$ (0<x<1), ZnO, ZnS, $ZnO_xS_{1-x}$ (0<x<1), that can be used to fabricate semiconductor devices including, but not limited to, blue and UV LEDs, white LEDs, blue and UV LDs, UV detectors, high frequency devices, solar cells and photoconductive devices.

Yet another embodiment of this invention is a ZnS single crystal of pure or substantially pure wurtzite structure that is intentionally doped with one or more impurities selected from the transition metal elements (e.g. $Co^{+2}$, $Cr^{+2}$, $Fe^{+2}$) so that the ZnS crystal is effective for used as a laser gain medium for lasers operated in the near IR range of 1-5 μm in wavelength.

Another embodiment of this invention is a sublimation physical vapor transport method, unseeded or otherwise seeded with a ZnS crystal seed, to produce all the aforementioned ZnS single crystals or multi-grain ZnS crystals of pure or substantially pure hexagonal wurtzite structure, undoped or doped, using a high purity ZnS material as source material and a high purity crucible. While still another embodiment of this invention is a chemical-assisted vapor transport method, unseeded or otherwise seeded with a ZnS crystal seed, to produce all the aforementioned ZnS single crystals or multi-grain ZnS crystals of pure or substantially pure hexagonal wurtzite structure, undoped or doped, utilizing a gas such as $H_2$, $H_2S$, or $I_2$, and a high purity ZnS material as source material, and a high-purity, non-reactive crucible. Yet another embodiment of this invention is a chemical vapor deposition method, unseeded or otherwise seeded with a ZnS crystal seed, to produce all the aforementioned ZnS single crystals or multi-grain ZnS crystals of pure or substantially pure hexagonal wurtzite structure, undoped or doped, utilizing a Zn vapor and a $H_2S$ gas as source materials and a carrier gas or gas mixture selected from $H_2$, Ar, $N_2$ and He, and in a high-purity, non-reactive crucible.

BRIEF DESCRIPTION OF THE DRAWINGS

Like reference numbers and designations in the various drawings indicated like elements.

DETAILED DESCRIPTION

Figure 1:
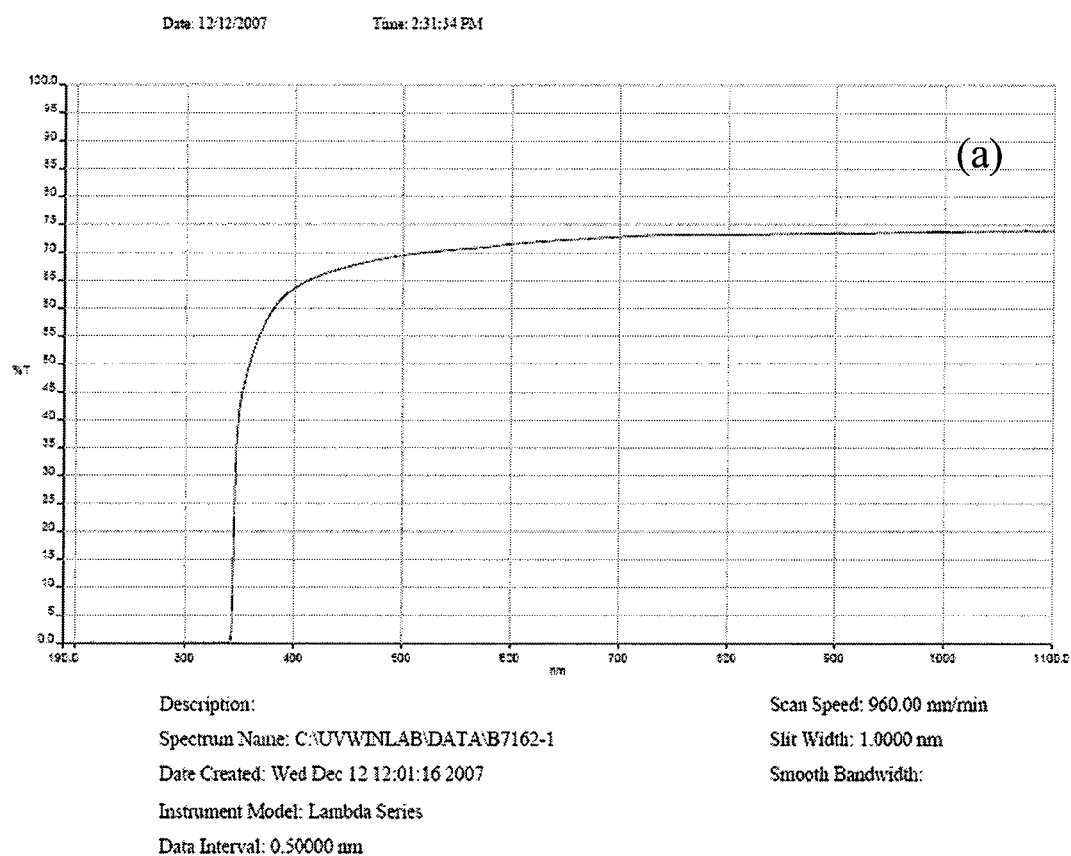
FIG. 1 graphically illustrates UV-VIS transmission recorded from a wurtzite-structure ZnS single crystal formed in accordance with this disclosure.

A first method to produce ZnS single crystal and multi-grain ZnS crystal of pure or substantially pure wurtzite structure is a physical vapor transport method. "Substantially pure" means 95% or more, by area, of the crystalline structure is wurtzite. Optionally, crystal growth and crystal orientation may be influenced by seeding the growth apparatus with ZnS crystal seeds. A high purity ZnS source material is selected from the group CVD-ZnS, Cleartran ZnS or a multi-spectral ZnS, a ZnS synthesized using Zn and S as starting materials. The growth temperature is in the range of 1350-1650° C. in a high purity crucible made from a material selected from the group pyrolytic boron nitride (pBN), glassy carbon, a refractory metal (such as Pt, Mo, Ir) and a refractory oxide (such as ZnO, $Al_2O_3$, sapphire, $ZrO_2$). The crystal is grown under a gas pressure of one or more carrier gases selected from the group Ar, $N_2$ and He with a total gas pressure within the growth furnace enclosure in the range of 10 torr to 1,500 torr. This method achieves an average crystal growth rate in the range of 0.2 mm-4.0 mm/hr.

A second method to produce the ZnS single crystal and multi-grain ZnS crystal of pure or substantially pure wurtzite structure is a chemical-assisted vapor transport method, optionally seeded with ZnS crystal seeds. A high purity ZnS source material is selected from the group CVD-ZnS, Cleartran ZnS or a multi-spectral ZnS, and ZnS synthesized using Zn and S as starting materials. The growth temperature is in the range of 1350-1650° C. in a high purity crucible made from a material selected from the group pBN, glassy carbon, and a refractory metal (such as Pt, Mo, Ir). The carrier gas is Ar, $N_2$ or a mixture thereof in combination with at least one reactive gas selected from the group $H_2$, $H_2S$, $Br_2$, $Cl_2$, $I_2$, and HCl. The total gas pressure is in the range of 10 torr to 1,500 torr. The average growth rate achieved is in the range of 0.2 mm-4.0 mm/hr.

A third method to produce the ZnS single crystal and multi-grain ZnS crystal of pure or substantially pure wurtzite structure is a CVD crystal growth method, seeded with ZnS crystal seeds. Zinc vapor and $H_2S$ vapor are used as the source materials at a growth temperature in the range of 1100-1500° C. in a high purity crucible. The crucible is made from a material selected from the group pBN and a refractory metal (such as Pt, Ir). The carrier gas is selected from the group $H_2$, Ar, $N_2$, and He and mixtures thereof with a total gas pressure in the range of 10 torr to 760 torr. The average growth rate achieved is in the range of 0.2 mm-2.0 mm/hr.

Each of the above methods may include doping the ZnS crystal with one or more impurities at a level of between 5 parts per million (ppm) and 5%, by weight, of each impurity. Suitable impurities include transition metal elements (Groups IB, IIIB-VIIIB elements in the Periodic Table), rare earth elements, Groups IA-VIIA elements in the periodic Table and transition ion elements including, but not limited to, $Co^{2+}$, $Cr^{2+}$. Typically, the impurity, in a gaseous state, will be added to the carrier gas.

When crystal growth is complete, the ZnS single crystal or multi-grain ZnS crystal is cooled to ambient temperature (nominally 22° C.) and then removed from the crystal growing apparatus by chemical etching or another reactive etching method and a substrate, thin film, thick film or bulk crystal recovered.

Through the use of a seed crystal, a number of hexagonal crystal orientation may be achieved, including:
a. Zn-face (0001) on-axis of within +/−1.0 degrees, more preferably +/−0.5 degrees;
b. S-face (0001) on-axis of within +/−1.0 degrees, more preferably +/−0.5 degrees;
c. Zn-face substantially off-axis from the [0001] crystal axis by an angle of 2-degrees to 15 degrees;
d. S-face substantially off-axis from the [0001] crystal axis by an angle of 2-degrees to 15 degrees;
e. Non-polar (1100) face (or m-face) of within +/−1.0 degrees, more preferably +/−0.5 degrees;
f. Non-polar (1120) face (or a-face) of within +/−1.0 degrees, more preferably +/−0.5 degrees;
g. Semi-polar orientation that is not identical with all the aforementioned orientations.

Highly pure (>99.999% by weight) ZnS single crystals or multi-grain ZnS crystals of pure or substantially pure wurtzite structure (herein thereafter defined as the amount of cubic and other non-wurtzite-structure polytype inclusions less than 5% in volume on average) are produced via a PVT growth method using high purity (nominally 99.999%, by weight pure) CVD-ZnS or Cleartran-ZnS pieces of about 0.2 mm to 8 mm in size as the ZnS source material and in high purity crucible and lid (that forms the crystal growth enclosure) made of pyrolytic boron nitride (PBN or denoted as pBN) or glassy carbon at a growth temperature in the range of 1350-1550° C. and under a gas pressure of 100-760 torr in an Ar gas or a $N_2$ gas. PBN having a chemical purity in excess of 99.999%, by weight, and total metallic impurities of less than 10 ppm is preferred for the crucible and lid. PBN is inert to ZnS solid, Zn vapor and S vapor in PVT growth temperatures of at least 1550° C.

The ZnS single crystals or multi-grain ZnS crystals of pure or substantially pure wurtzite structure produced in this manner have an optical transmission in the visible and IR spectrum in the wavelength range of approximately 0.34-14 μm, better than or equivalent to that of the currently commercially available Cleartran ZnS and multi-spectral ZnS crystal materials. Still further the ZnS single crystals or multi-grain ZnS crystals produced in the manner disclosed herein have no naked-eye noticeable light scattering of a red He—Ne laser light, while currently commercially available ZnS materials have naked-eye noticeable light scattering of red laser light. The inventor further infers that ZnS single crystals and multi-grain crystals produced in the manner disclosed in this invention have low bulk absorption coefficients of less than 0.001 $cm^{-1}$ at a wavelength of 10.6 μm and therefore are suitable for fabricating optical components for high power $CO_2$ lasers.

Still further, the ZnS single crystals of pure or substantially pure wurtzite structure produced in the manner disclosed herein have a high crystalline perfection and low densities of crystalline defects. For example, the ZnS single crystals of wurtzite structure disclosed have etch-pit densities less than 100 $cm^{-2}$ and they are substantially free of grain boundaries, voids, precipitates and polytype inclusions. Such high quality ZnS single crystals are useful to fabricate a variety of semiconductor devices.

Further, the multi-grain ZnS crystals of pure or substantially pure wurtzite structure produced in this manner have a high crystalline perfection and low densities of crystalline defects (excluding the grain boundaries separating individual single crystal grains), e.g. average dislocation densities less than 1,000 $cm^{-2}$ and are substantially free of voids, precipitates, and inclusions; and such multi-grain ZnS crystals are useful to fabricate a variety of semiconductor devices for applications where large-area, low-cost ZnS crystals are required. The ZnS single crystals or multi-grain ZnS crystals of pure or substantially pure wurtzite structure could be produced at a significantly lower cost than that for the currently commercially available ZnS materials. The process in which the ZnS single crystals or multi-grain ZnS crystals of pure or substantially pure wurtzite structure are produced is a safer process because there are not large amounts of chemical gases involved in the PVT growth process, which is superior to the known CVD processes for producing ZnS. Further, the process in which the ZnS single crystals or multi-grain ZnS crystals of pure or substantially pure wurtzite structure are produced is an environmentally friendly process because a significant portion (larger than 75%) of the ZnS crystals produced can be reused and recycled as a source material in a further PVT growth of ZnS crystals, which significantly reduces the ZnS source materials or Zn or S source materials needed for the crystal growth and the amount of ZnS released into the environment, while it is difficult and cost-prohibitive to reuse and recycle ZnS crystal materials in a CVD process.

The ZnS single crystals or multi-grain ZnS crystals possess superior physical properties and are suitable for many applications. More specifically, the ZnS single crystals or multi-grain ZnS crystals of pure or substantially pure wurtzite structure can be used in applications, including, but not limited to, optical components (operated in the IR & visible spectrum range of 0.33-14 μm), photoluminescence devices, cathode luminescence devices, electroluminescence devices, semiconductor devices, and IR laser gain mediums (in the wave length range of 1-5 μm).

One embodiment is a ZnS single crystal or a multi-grain ZnS crystal of pure or substantially pure wurtzite structure with a high chemical purity (at least 99.999% by weight) and a high crystalline perfection that give rise to a high transmission, a low absorption and a low scattering of lights in the wavelength range of visible and IR (i.e. 0.34-14 μm) superior to predominantly cubic ZnS materials, such as CVD-ZnS, Cleartran ZnS or Multi-Spectral ZnS materials, and such wurtzite-structure ZnS single crystals and multi-grain crystals are suitable for fabricating optical components including, but not limited to, IR, forward looking IR (FLIR), and high power $CO_2$ laser components, such as windows, lenses, prisms, mirrors, reflectors, beam splitters, filters, wave plates, operated in the visible and IR spectrum range of 0.34-14 μm in wavelength.

Another embodiment is a ZnS single crystal or a multi-grain ZnS crystal of pure or substantially pure wurtzite structure that is intentionally doped with one or more impurities including, but not limited to, the transition metal elements and rare-earth elements and such doped ZnS single crystals and multi-grain crystals are suitable for fabricating photoluminescence devices, such as scintillation detectors for detection or imaging of radiations of UV light, X-rays, gamma-rays, and neutrons.

Another embodiment is a ZnS single crystal or a multi-grain ZnS crystal of pure or substantially pure wurtzite structure that is intentionally doped with one or more impurities including, but not limited to, the transition metal elements and rare-earth elements and such doped ZnS single crystals and multi-grain crystals are suitable for fabricating cathode luminescence devices, such as cathode ray tubes (CRTs), CRT-type television sets, field emission displays, or other devices for detection or imaging of electron beams (also known as cathode rays).

Another embodiment is a ZnS single crystal or a multi-grain ZnS crystal of pure or substantially pure wurtzite structure that is intentionally doped with one or more impurities (activators), and such doped ZnS single crystals and multi-grain crystals are suitable for fabricating electroluminescence (EL) devices including but not limited to devices emitting visible lights (e.g. blue, green, yellow, red, and white) and electroluminescence displays of single color, multi-color, or full-color.

Another embodiment is a ZnS single crystal or a multi-grain ZnS crystal or a multi-grain ZnS crystal of pure or substantially pure wurtzite structure that is unintentionally doped or intentionally doped with one or more electronically-active impurities so that the ZnS single crystals and multi-grain crystals are either electrically insulating, or semi-insulating, or conducting (i.e. low resistivity) with n-type or p-type conduction; and such ZnS single crystals and multi-grain crystals, usually in a wafer form or a substrate form with or without one or more thin film layers of ZnS or other II-VI, or III-V, chalcopyrite and related semiconductors, or other semiconductor materials grown on the ZnS crystal wafers or substrates, are used to fabricate semiconductor devices including, but not limited to, LEDs, LDs, UV detectors, high frequency devices, high power devices, solar cells, photoconductive devices. Moreover, because ZnS can be dissolved completely by using common acids, such as 98% to 0.1N $H_2SO_4$ at room temperature (nominally 22° C.), substrates made of ZnS single crystal or multi-grain ZnS crystal used for fabricating semiconductor devices can be completely removed through a chemical etching or other reactive etching methods in the final steps of device fabrication so that true substrate-free (or thin-film-only) devices can be produced. This is particular advantageous for light emitting diodes in which a substrate-free device can achieve much better light extraction.

Another embodiment is that a ZnS single crystal or multi-grain ZnS crystals of pure or substantially pure wurtzite structure is used as a substrate for epitaxial growth of thin films (less than 10 μm in thickness), or thick films (of 10-1000 μm), or bulk crystals (larger than 1 mm in thickness in the growth direction) of group III-nitride, II-VI, III-V, group IV semiconductors and other semiconductors including, but not limited to, GaN, AlN, InN, $Ga_xIn_{1-x}N$ (0<x<1), $Ga_xAl_{1-x}N$ (0<x<1), ZnO, ZnS, $ZnO_xS_{1-x}$ (0<x<1), that can be used to fabricate semiconductor devices including, but not limited to, blue and UV LEDs, white LEDs, blue and UV LDs, UV detectors, high frequency devices, solar cells, photoconductive devices. Moreover, ZnS single crystal or multi-grain ZnS crystal used as the substrates or seeds for growing semiconductor thin films, thick films and bulk crystals can be completely removed through a chemical etching or other reactive etching methods so that freestanding thin films, thick films or bulk crystals of these materials are produced.

Yet another embodiment is a ZnS single crystal of pure or substantially pure wurtzite structure that are intentionally doped with one or more impurities selected from the transition metal elements (e.g. $Co^{+2}$, $Cr^{+2}$, $Fe^{+2}$) so that the ZnS crystal is effective for use as a laser gain medium for lasers in the near IR range of 1-5 μm in wavelength.

Another embodiment of this invention is a sublimation physical vapor transport method, unseeded or otherwise seeded with a ZnS crystal seed, to produce all the aforementioned ZnS single crystals or multi-grain ZnS crystals of pure or substantially pure hexagonal wurtzite structure, undoped or doped, using a high purity ZnS material as source material and a high purity crucible. While still another embodiment of this invention is a chemical-assisted vapor transport method, unseeded or otherwise seeded with a ZnS crystal seed, to produce all the aforementioned ZnS single crystals or multi-grain ZnS crystals of pure or substantially pure hexagonal wurtzite structure, undoped or doped, utilizing a gas such as $H_2$, $H_2S$, or $I_2$, and a high purity ZnS material as source material, and a high-purity, non-reactive crucible. Yet another embodiment of this invention is a chemical vapor deposition method, unseeded or otherwise seeded with a ZnS crystal seed, to produce all the aforementioned ZnS single crystals or multi-grain ZnS crystals of pure or substantially pure hexagonal wurtzite structure, undoped or doped, utilizing a Zn vapor and a $H_2S$ gas as source materials and a carrier gas or gas mixture selected from $H_2$, Ar, $N_2$ and helium (He), and in a high-purity, non-reactive crucible.

The following Example illustrates advantages of methods and products disclosed herein.

EXAMPLE

Growths of ZnS single crystals or multi-grain crystals were carried out using a CVD-ZnS as the source material and a pyrolytic BN (pBN) crucible (of 10-12 mm in inner diameter and 70-100 mm in length). The key growth parameters are listed in Table 1.

TABLE 1

| Growth Parameters | Range of Values |
|---|---|
| Source Temperature ($T_s$), (° C.) | 1350-1550 |
| Axial thermal gradient (dT/dz), (° C./cm) | 3-30 |
| Source-Crystal Distance ($\Delta D_{sc}$), (mm) | 10-50 |
| System Ar (or $N_2$) pressure (P), (torr) | 100-760 |
| Growth Time (t), (hrs) | 5-20 |

There were no seeds used in the growths and ZnS crystals formed directly onto the crucible lid. The as-grown ZnS crystal boules of about 10-25 mm in length and 10-12 mm in diameter were either single crystals or multi-grain crystals. All the ZnS crystals were water-clear. The ZnS single crystal boules showed well-developed facets of {1 1̄00}, {1 1̄20} and {0001} facets on the last-to-grow portions of the boules, which suggests that the ZnS single crystal boules have a hexagonal structure. The multi-grain boules contained a maximum of four single crystal grains, and some of the single crystal grains contained some well-developed facets of {1 1̄00}, {1 1̄20} and {0001} facets, which suggests that the multi-grain ZnS crystal boules have a hexagonal structure. Average growth rates in the growths conducted were in the range of 0.4-2.5 mm/hr and a higher or a lower growth rate can be achieved by varying the gas pressure or the growth temperature.

Figure 2:
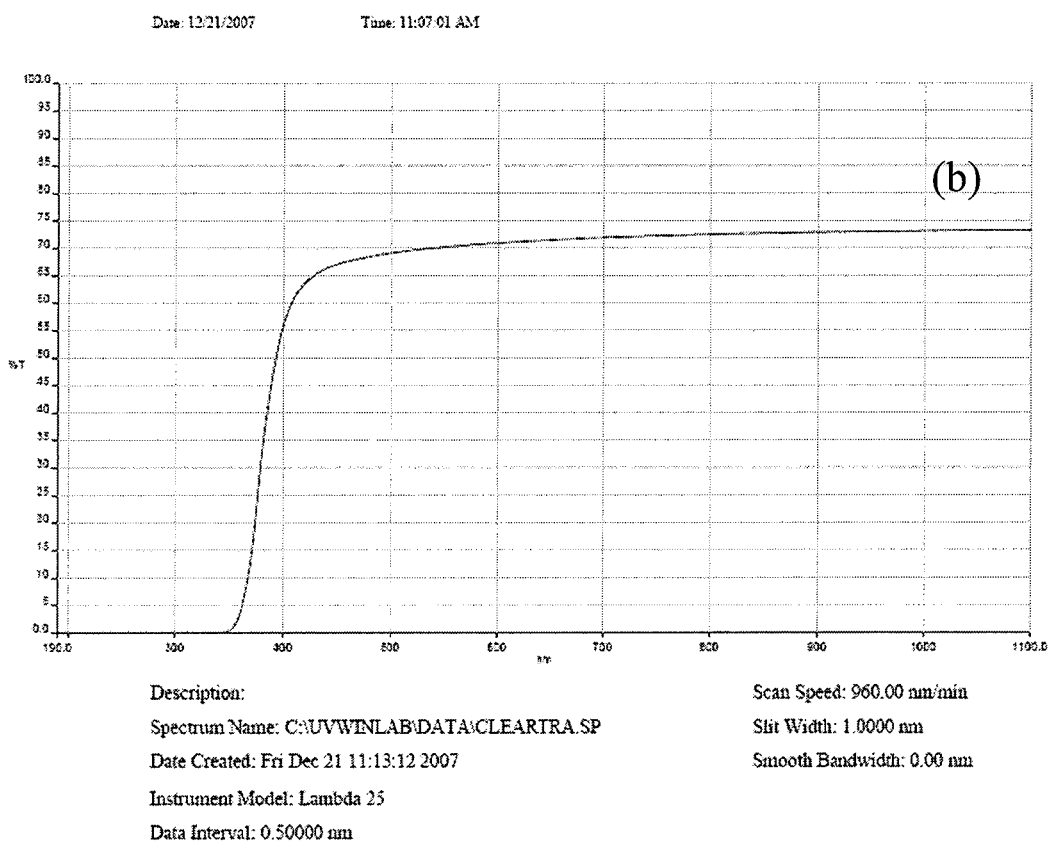
FIG. 2 graphically illustrates UV-VIS transmission recorded from a polished window made of ZnS from the prior art.

Light transmission tests were performed on polished samples (1-3 mm in thickness) of ZnS single crystals and multi-grain ZnS crystals, and samples of commercially acquired polished windows (2-4 mm in thickness) made from both Cleartran ZnS and multi-spectral ZnS materials in the near UV, visible and near IR spectrum region (i.e. 190 nm-1100 nm in wavelength) utilizing a UV/VIS system (Lambda 25 by Perkin-Elmer). A typical plot of light transmission versus wavelength recorded from a ZnS single crystal or a multi-grain ZnS crystal disclosed in this invention is shown in FIG. 1, where a typical plot of light transmission versus wavelength recorded from polished windows made of Cleartran ZnS is shown in FIG. 2. It was found that the single crystals or multi-grain ZnS crystals produced in the manner disclosed herein had a better transmission in the wavelength 0.35-0.5 μm than a Cleartran ZnS material. The single crystals or multi-grain ZnS crystals produced had an absorption edge at the wavelength of approximately 340 nm, while the absorption edge of Cleartran ZnS is approximately 360 nm. The clear difference in UV absorption edges results from the band gap difference, i.e. the band gap for hexagonal wurtzite-structure ZnS crystals (the current invention) is 3.8 eV, while the band gap for cubic ZnS crystals (Cleartran ZnS or multi-spectral ZnS) is 3.7 eV.

A light scattering test was also performed on polished samples of ZnS single crystals and multi-grain ZnS crystals, and samples of commercially acquired polished windows made from Cleartran ZnS materials utilizing a He—Ne red laser light of the wavelength approximately 632 nm. All the samples of ZnS single crystals and multi-grain ZnS crystals of pure or substantially pure wurtzite structure had no naked-eye noticeable light scattering path, while all the samples of Cleartran ZnS polished windows had a naked-eye noticeable light path arising from light scattering. This result confirms that light scattering in ZnS single crystals and multi-grain ZnS crystals disclosed in this invention are drastically lower than that in Cleartran ZnS and multi-spectral ZnS materials.

Observation of polished ZnS single crystals or multi-grain crystals produced in the manner described earlier showed that a majority of the crystals had no visible defects, such as inclusions, voids or cracks. Chemical etching of selected ZnS single crystals or multi-grain crystals produced in the manner disclosed herein was carried out to show the crystal structure and crystalline defects in the ZnS crystals. The etching was carried out in a molten sodium hydroxide (NaOH) or a molten potassium hydroxide (KOH) at a temperature of approximately 380-400° C. for a duration of 5-20 minutes. Etch-pits were then observed under an optical microscope at magnifications of 50×, 100×, 200× and 500×. Well-defined hexagonal etch-pits of about 10-50 μm in size were observed in the ZnS single crystal samples sliced close to the {0001} lattice planes, which confirms the hexagonal structure of ZnS single crystals and multi-grain crystals produced in the manner described herein. The densities of hexagonal etch-pits, which are associated with dislocations, in the ZnS single crystals, are in the range of 10 to 100 $cm^{-2}$, with majority of the crystal areas etch-pit-free. There are no etched features associated with grain boundaries in the ZnS single crystals produced in the manner described herein. The densities of hexagonal etch-pits in multi-grain ZnS crystals are in the range of 10 to 400 $cm^{-2}$, with majority of the crystal area of each grain etch-pit-free.

One or more embodiments of the present invention have been described. Nevertheless, it will be understood that various modifications may be made without departing from the spirit and scope of the invention. Accordingly, other embodiments are within the scope of the following claims.

What is claimed is:

1. A method for producing a ZnS structure having at least 95% wurtzite structure by volume and being either a single crystal or a multi-grain ZnS crystal with an average grain size of at least 1 mm by a physical vapor transport method, comprising the steps of:
    disposing a ZnS source in a high purity crucible located at one end of a growth furnace enclosure;
    heating said ZnS source material to a temperature in the range of 1350° C. to 1650° C. generating a vapor-phase of said ZnS source;
    providing a carrier gas selected from the group consisting of Ar, $N_2$, He and mixtures thereof at a total gas pressure within the growth furnace enclosure in the range of 10 torr to 1,500 torr; and
    depositing said ZnS structure at a second end of said growth furnace enclosure an average crystal growth rate in the range of 0.2 mm-4.0 mm/hr.

2. The method of claim 1 wherein said ZnS source is selected from the group consisting of CVD-ZnS, Cleartran ZnS, multi-spectral ZnS and ZnS synthesized from Zn and S starting materials.

3. The method of claim 1 including the step of seeding said second end of said growth furnace with ZnS crystal seeds.

4. The method of claim 1 wherein said high purity crucible is formed from a material selected from the group consisting of pyrolytic boron nitride, glassy carbon, a refractory metal and a refractory oxide.

5. A method for producing a ZnS structure having at least 95% wurtzite structure by volume and being either a single crystal or a multi-grain ZnS crystal with an average grain size of at least 1 mm by a chemical-assisted physical vapor transport method, comprising the steps of:
    disposing a ZnS source in a high purity crucible located at one end of a growth furnace enclosure;
    heating said ZnS source material to a temperature in the range of 1350° C. to 1650° C. generating a vapor-phase of said ZnS source;
    combining a carrier gas selected from the group consisting of Ar, $N_2$ and mixtures thereof with a reactive gases selected from the group consisting of $H_2$, $H_2S$, $Br_2$, $Cl_2$, $I_2$, HCl and mixtures there of at a total gas pressure within the growth furnace enclosure in the range of 10 torr to 1,500 torr; and
    depositing said ZnS structure at a second end of said growth furnace enclosure an average crystal growth rate in the range of 0.2 mm-4.0 mm/hr.

6. The method of claim 5 wherein said ZnS source is selected from the group consisting of CVD-ZnS, Cleartran ZnS, multi-spectral ZnS and ZnS synthesized from Zn and S starting materials.

7. The method of claim 5 including the step of seeding said second end of said growth furnace with ZnS crystal seeds.

8. The method of claim 5 wherein said high purity crucible is formed from a material selected from the group consisting of pyrolytic boron nitride, glassy carbon and a refractory metal and a refractory oxide.

9. A method for producing a ZnS structure having at least 95% wurtzite structure by volume and being either a single crystal or a multi-grain ZnS crystal with an average grain size of at least 1 mm by a chemical vapor transport method, comprising the steps of:

disposing Zn and $H_2S$ source materials in a high purity crucible located at one end of a growth furnace enclosure;

heating said source materials to a temperature in the range of 1100° C. to 1500° C. generating vapor-phase Zn and $H_2S$;

providing a carrier gas selected from the group consisting of Ar, $N_2$, He, $H_2$ and mixtures thereof at a total gas pressure within the growth furnace enclosure in the range of 10 torr to 760 torr; and depositing said ZnS structure at a second end of said growth furnace enclosure an average crystal growth rate in the range of 0.2 mm-2.0 mm/hr.

10. The method of claim 9 including the step of seeding said second end of said growth furnace with ZnS crystal seeds.

11. The method of claim 9 wherein said high purity crucible is formed from a material selected from the group consisting of pyrolytic boron nitride and a refractory metal.

* * * * *